United States Patent
Cheng et al.

(10) Patent No.: US 10,103,478 B1
(45) Date of Patent: Oct. 16, 2018

(54) WATER RESISTANT CONNECTORS WITH CONDUCTIVE ELEMENTS

(71) Applicant: Amazon Technologies, Inc., Seattle, WA (US)

(72) Inventors: Shan Cheng, Seattle, WA (US); Carl Philip Taussig, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/631,213

(22) Filed: Jun. 23, 2017

(51) Int. Cl.
- H01R 4/24 (2018.01)
- H01R 13/523 (2006.01)
- H01R 13/52 (2006.01)
- H05K 3/28 (2006.01)
- H05K 1/18 (2006.01)

(52) U.S. Cl.
CPC ....... H01R 13/523 (2013.01); H01R 13/5219 (2013.01); H05K 1/185 (2013.01); H05K 1/188 (2013.01); H05K 3/284 (2013.01); H05K 2201/09872 (2013.01)

(58) Field of Classification Search
CPC .... H01R 13/523; H01R 13/5219; H01R 4/24; H01R 4/26; H01R 4/2404; H01R 2103/00; H05K 1/188; H05K 1/185; H05K 3/284
USPC .......................................... 439/426, 936, 43
See application file for complete search history.

(56) References Cited

U.S. PATENT DOCUMENTS

| | | | | |
|---|---|---|---|---|
| 1,067,024 A | * | 7/1913 | Hall et al. | H02G 3/00 313/51 |
| 2,295,188 A | * | 9/1942 | Starnes | G09F 13/26 307/29 |
| 2,700,140 A | * | 1/1955 | Phillips | H01R 9/032 174/77 R |
| 2,983,779 A | * | 5/1961 | Dumire | H01R 24/40 174/665 |
| 3,715,457 A | * | 2/1973 | Teagno | H01R 4/182 174/88 R |
| 3,824,529 A | * | 7/1974 | Dorrell | H01R 4/2412 439/325 |
| 3,853,385 A | * | 12/1974 | Palazzetti | H01R 4/2404 439/190 |
| 4,023,882 A | * | 5/1977 | Pettersson | H01R 4/26 439/426 |
| 4,270,874 A | * | 6/1981 | March | E02B 15/08 405/63 |
| 4,456,145 A | * | 6/1984 | Frank | H02G 3/14 220/242 |
| 4,581,495 A | * | 4/1986 | Geri | H04M 1/02 361/730 |

(Continued)

Primary Examiner — Abdullah Riyami
Assistant Examiner — Vladimir Imas
(74) Attorney, Agent, or Firm — Eversheds Sutherland (US) LLP

(57) ABSTRACT

Systems, methods, and computer-readable media are disclosed for water resistant connectors having conductive elements. In one embodiment, an example water resistant connector may include a first connector with a first conductive layer and a first water resistant layer adjacent to the first conductive layer, and a circuit component with a second conductive layer positioned on a first side of the circuit component, and a second water resistant layer adjacent to the second conductive layer. The first conductive layer and the second conductive layer may be in contact in a connected configuration.

20 Claims, 5 Drawing Sheets

(56) References Cited

U.S. PATENT DOCUMENTS

| | | | | |
|---|---|---|---|---|
| 4,888,232 A * | 12/1989 | Sallberg | G09F 13/28 | 428/215 |
| 4,924,362 A * | 5/1990 | Janko | A01K 27/006 | 362/108 |
| 5,071,363 A * | 12/1991 | Reylek | H01R 4/26 | 439/290 |
| 5,168,124 A * | 12/1992 | Takase | H01R 4/70 | 174/23 R |
| 5,237,743 A * | 8/1993 | Busacco | H01R 4/26 | 29/874 |
| 5,247,424 A * | 9/1993 | Harris | H01R 13/5202 | 174/547 |
| 5,315,065 A * | 5/1994 | O'Donovan | H01R 4/20 | 174/84 C |
| 5,334,039 A * | 8/1994 | Kanda | C08J 5/124 | 264/135 |
| 5,353,536 A * | 10/1994 | Erber | G09F 15/0012 | 40/606.09 |
| 5,358,135 A * | 10/1994 | Robbins | H02B 1/066 | 220/326 |
| 5,384,690 A * | 1/1995 | Davis | H01R 12/613 | 174/262 |
| 5,386,616 A * | 2/1995 | Norvell | A44B 19/32 | 24/384 |
| 5,406,027 A * | 4/1995 | Matsumoto | H01L 25/162 | 174/260 |
| 5,474,843 A * | 12/1995 | Lambert | B41M 5/5245 | 347/105 |
| 5,491,300 A * | 2/1996 | Huppenthal | G06F 1/20 | 174/151 |
| 5,573,845 A * | 11/1996 | Parthasarathi | B32B 7/04 | 428/220 |
| 5,656,378 A * | 8/1997 | Lambert | B41M 5/5245 | 347/105 |
| 5,669,085 A * | 9/1997 | Wilson | A47K 5/02 | 206/77.1 |
| 5,928,989 A * | 7/1999 | Ohnishi | B41M 7/0027 | 428/195.1 |
| 5,942,333 A * | 8/1999 | Arnett | B05B 7/20 | 428/461 |
| 5,969,069 A * | 10/1999 | Su | B41M 3/006 | 526/317.1 |
| 6,053,749 A * | 4/2000 | Masuda | H01R 13/5202 | 439/98 |
| 6,066,120 A * | 5/2000 | Whiteside | A61F 5/445 | 604/332 |
| 6,165,398 A * | 12/2000 | Matsumoto | B22F 3/22 | 264/87 |
| 6,332,809 B1 * | 12/2001 | Tsukamoto | H01R 13/5208 | 439/589 |
| 6,484,016 B1 * | 11/2002 | Cheon | H01R 35/02 | 16/386 |
| 6,485,333 B1 * | 11/2002 | Shinchi | H01R 13/504 | 174/77 R |
| 6,527,574 B1 * | 3/2003 | Murakami | H01R 13/502 | 439/275 |
| 6,657,381 B1 * | 12/2003 | Arutaki | G09F 9/33 | 313/512 |
| 6,665,192 B2 * | 12/2003 | Wimberger Friedl | H05K 5/065 | 174/565 |
| 6,711,024 B1 * | 3/2004 | Johansson | H05K 1/189 | 361/760 |
| 6,802,720 B2 * | 10/2004 | Weiss | H01R 13/2414 | 439/591 |
| 6,865,805 B2 * | 3/2005 | Dispenza | H05K 7/1425 | 174/358 |
| 6,991,490 B1 * | 1/2006 | Su | H01R 13/5213 | 439/136 |
| 6,994,590 B2 * | 2/2006 | Nishida | H01R 13/5219 | 439/271 |
| 7,035,105 B2 * | 4/2006 | Yamaguchi | B60R 16/0238 | 165/80.3 |
| 7,131,739 B2 * | 11/2006 | Sellgren | H05B 3/845 | 359/507 |
| 7,347,731 B1 * | 3/2008 | Gilmore | H01R 13/405 | 439/587 |
| 7,364,440 B2 * | 4/2008 | Gobron | H01R 13/025 | 439/77 |
| 7,417,873 B2 * | 8/2008 | Kadoya | B29C 45/14377 | 257/E21.504 |
| 7,534,127 B2 * | 5/2009 | Parker | A61N 1/3752 | 439/425 |
| 7,950,935 B2 * | 5/2011 | Lin | H01R 13/5213 | 429/97 |
| 7,964,104 B2 * | 6/2011 | Omasa | A23B 7/157 | 210/748.01 |
| 8,002,565 B2 * | 8/2011 | Bogart | H01R 13/5202 | 439/281 |
| 8,003,898 B2 * | 8/2011 | Hayashi | F16J 15/14 | 174/385 |
| 8,106,312 B2 * | 1/2012 | Shinoda | H05K 5/069 | 174/554 |
| 8,178,794 B2 * | 5/2012 | Hayashi | H05K 1/0281 | 174/564 |
| 8,260,128 B1 * | 9/2012 | Sturm | G03B 17/08 | 206/316.2 |
| 8,330,854 B2 * | 12/2012 | Kossin | H04N 5/2252 | 348/372 |
| 8,414,308 B1 * | 4/2013 | Meyers | H01L 31/05 | 439/67 |
| 8,418,415 B2 * | 4/2013 | Shiao | H01L 31/048 | 136/244 |
| 8,625,290 B2 * | 1/2014 | Wee | H05K 5/069 | 174/152 G |
| 8,641,229 B2 * | 2/2014 | Li | F21V 17/007 | 362/219 |
| 8,758,053 B2 * | 6/2014 | Paynter | H01R 4/5025 | 439/454 |
| 8,838,190 B2 * | 9/2014 | Komiyama | H04M 1/021 | 455/347 |
| 8,912,454 B2 * | 12/2014 | Sasaki | H04M 1/0235 | 174/50.5 |
| 8,979,554 B2 * | 3/2015 | Yudate | H01R 13/5202 | 439/271 |
| 9,042,095 B2 * | 5/2015 | Song | G06F 1/1626 | 361/679.21 |
| 9,176,527 B2 * | 11/2015 | Lee | G06F 1/1626 | |
| 9,228,732 B2 * | 1/2016 | Li | F21S 4/28 | |
| 9,310,836 B2 * | 4/2016 | Srinivas | G06F 1/1626 | |
| 9,323,292 B2 * | 4/2016 | Bae | G06F 1/1656 | |
| 9,336,969 B2 * | 5/2016 | Takashima | G06F 1/1626 | |
| 9,373,558 B2 * | 6/2016 | Tsuyuno | H01L 25/072 | |
| 9,414,804 B2 * | 8/2016 | Stonefield | A61B 8/00 | |
| 9,442,520 B2 * | 9/2016 | Srinivas | G06F 1/1626 | |
| 9,541,431 B2 * | 1/2017 | Nakano | G01F 1/66 | |
| 9,560,749 B2 * | 1/2017 | Stanley | H05K 1/028 | |
| 9,565,342 B2 * | 2/2017 | Sauer | H04N 5/2257 | |
| 9,628,707 B2 * | 4/2017 | Blum | H04N 5/23241 | |
| 9,654,605 B2 * | 5/2017 | Goldfain | A45C 11/182 | |
| 9,659,498 B2 * | 5/2017 | Kendall | B60R 1/06 | |
| 9,735,398 B2 * | 8/2017 | Aoyama | H01L 51/56 | |
| 9,793,644 B2 * | 10/2017 | Fujii | H01R 13/5202 | |
| 9,847,028 B1 * | 12/2017 | Kendall | B60R 1/1207 | |
| 9,874,901 B2 * | 1/2018 | Seok | G06F 1/163 | |
| 2005/0264986 A1 * | 12/2005 | Kee | G06F 1/1616 | 361/679.21 |
| 2009/0291532 A1 * | 11/2009 | Takase | B29C 43/18 | 438/127 |
| 2012/0235951 A1 * | 9/2012 | Brown | G06F 3/0412 | 345/174 |

* cited by examiner

WATER RESISTANT CONNECTORS WITH CONDUCTIVE ELEMENTS

BACKGROUND

Electronic devices, such as mobile phones, tablets, watches, and the like may be subject to environments with liquid, such as water. For example, a mobile phone may be used outdoors in the rain, or may accidentally be dropped into a puddle of water. In another example, a digital watch may be used during swimming or showering. Water and other liquids may potentially harm electrical components of devices. In addition, while external surfaces of electronic devices may be treated with waterproof or water resistant coatings, internal components, such as circuitry, may be susceptible to damage from liquid. Accordingly, water resistant and water proof devices and components may be desired.

Figure 1:
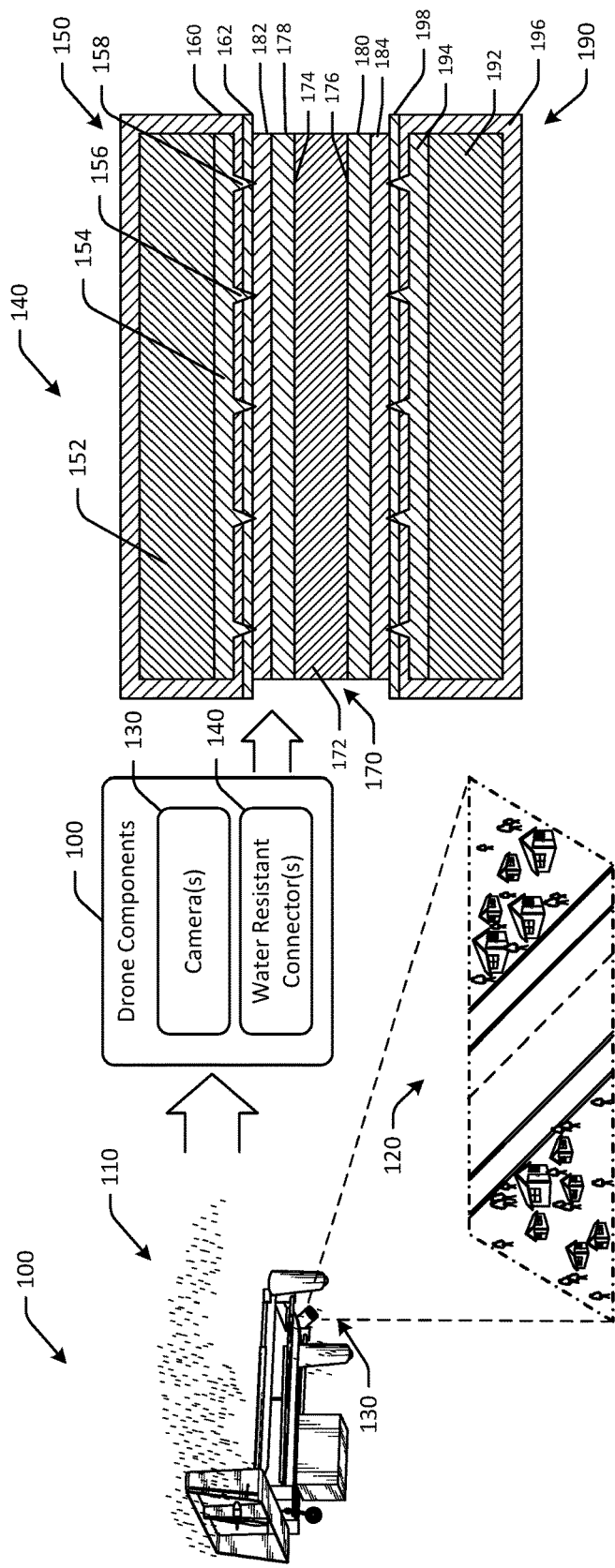
FIG. 1 is an example use case and schematic drawing of a water resistant device that includes water resistant connectors having conductive elements in accordance with one or more embodiments of the disclosure.

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. The use of the same reference numerals indicates similar, but not necessarily the same or identical components. Different reference numerals may be used to identify similar components. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

Electronic devices, such as laptops, smartphones, tablets, e-readers, speaker devices, drones, and other electronic devices may be subject to, or may otherwise be exposed to, environments that have water or other liquids. Such liquids may cause damage to one or more components of the electronic device. For example, a mobile device that is dropped in a puddle of liquid may be damaged by ingress of the liquid, which can result in corrosion of internal or external components or surfaces. Similarly, a drone flying in the rain may be subject to water that can cause corrosion or otherwise damage one or more components of the drone. Other examples of situations that may cause damage to one or more components of an electronic device include extended exposure to humid environments, submersion or immersion in liquid, and other exposure to liquids.

Embodiments of the disclosure include water resistant and/or waterproof electrical connectors that are configured to create water resistant or waterproof electrical connections between conductive material layers without destroying or damaging the conductive material and/or exposing the conductive material layers. Certain embodiments may prevent or reduce a likelihood of corrosion as a result of liquid or fluid exposure to a device, and may create electrical connections with low connection resistance. As a result, devices that include water resistant connectors as described herein may have improved resistance to liquid ingress and/or may prevent liquid from damaging one or more components or surfaces of an electronic device. In some embodiments, devices may therefore not only have external resistance to liquid or fluid ingress, but internal resistance to liquid damage as well. Some embodiments may preserve or protect one or more components of an electronic device even in situations where fluid has entered the device.

This disclosure relates to, among other things, systems, methods, computer-readable media, techniques, and methodologies for water resistant connectors having conductive elements. Embodiments may include water resistant connectors that include components dipped or covered in water resistant material, along with surface features or formations on conductive layers that engage with opposing conductive layers to form secure electrical connections that are wholly protected or surrounded by water resistant material. Some embodiments may include one or more adhesive layers, such as a pressure sensitive adhesive layer, to further secure a bond between adjacent connector components. Certain embodiments may include water resistant materials with capsules of encapsulation material suspended in a solution (pre-cure) and/or dispersed in the water resistant coating layer (post-cure), where the capsules burst during a connection process, and the burst capsules release a liquid water resistant material that forms a water resistant barrier after a connection is complete (e.g., a self-healing water resistant barrier, etc.). As a result, devices that include water resistant connectors or waterproof connectors may have increased resistance to liquid damage and may therefore have improved functionality. Further, some water barrier coatings may be dielectric, and therefore cannot be used in areas with electric connectivity. Because of this, other devices may use a masking and demasking process for connectors, along with a post encapsulation process to protect the connectors. Such processes add cost and performance risk, and can be avoided using the water resistant connectors described herein. While described in the context of zero insertion force and board-to-board connectors, this disclosure is more broadly applicable to other electrical connectors, such as connect-through connectors.

Referring to FIG. 1, an example use case and schematic drawing of a water resistant device that includes water resistant connectors having conductive elements in accordance with one or more embodiments of the disclosure. In FIG. 1, a drone 100 may be operating in an ambient environment 110 that includes rain and/or other liquids. The rain and/or other liquids may contact and/or accumulate on the drone 100. The drone 100 may use one or more cameras 130 or other device to survey a current location 120 of the drone 100, for example, to locate a delivery address for a package that the drone 100 is carrying.

The drone 100 may include one or more electronic components with electrical connectors. For example, the drone 100 may include the camera 130 and one or more water resistant connectors 140 to connect the camera 130 to another component of the drone 100, such as a computer processor, power supply, or other component. The water resistant connector 140 may be used externally (e.g., external to a housing of the drone 100, or otherwise exposed to the ambient environment, etc.), or internally (e.g., within the housing of the drone 100, etc.).

The water resistant connector 140 may be, in the example of FIG. 1, a zero insertion force water resistant connector, a board-to-board water resistant connector, or another type of connector. In the example of FIG. 1, the water resistant connector 140 may include one or more connector portions and one or more circuit portions, such as a flexible circuit portion.

In FIG. 1, the water resistant connector 140 may include a first connector portion 150, a flexible circuit 170, and a second connector portion 190. The first connector portion 150 may engage a first side of the flexible circuit 170 when the water resistant connector 140 is in a closed, mated, or connected configuration, such as the depicted configuration. The second connector portion 190 may engage a second side of the flexible circuit 170 when the water resistant connector 140 is in the closed configuration, mated configuration, or connected configuration. The second side may be opposite the first side.

The first connector portion 150 may include a first substrate 152 that may be a circuit or may form a base for the first connector portion 150 and/or may provide structural integrity. Substrates may be circuits, boards, or other components of a connector. The first connector portion 150 may include a first conductive layer 154 laminated to or otherwise disposed on the first substrate 152. The first conductive layer 154 may be formed of a conductive material, such as a copper or aluminum foil, or another conductive material. The first conductive layer 154 may include a surface having a number of asperities or surface features formed on the surface. Asperities may be a roughness or other material characteristic that causes some portions of the material to be raised relative to others. Surface features may include one or more conical protrusions, raised protrusions, blade-like protrusions, ridges, ripples, grooves, peaks, valleys, or other surface features extending from and/or extending into a surface of the first conductive layer 154. Surface features may be spaced apart at equal or uniform distances, while in other embodiments, surface features may be spaced at non-uniform distances. Some embodiments may include a number of different types of surface features, such as a combination of conical protrusions and blade-like protrusions, or other combinations of multiple surface feature types.

For example, in FIG. 1, the first conductive layer 154 may include a set of conical protrusions extending from a surface of the first conductive layer 154. The set of conical protrusions may include a first conical protrusion 156 extending from the surface and a second conical protrusion 158 extending from the surface. The first conical protrusion 156 and the second conical protrusion 158 may have the same height with respect to the surface of the first conductive layer 154. Other embodiments may have surface features of different heights.

The first connector portion 150 may include a first water resistant coating 160. The first water resistant coating 160 may cover some or all of the external surfaces of the first connector portion 150. For example, the first connector portion 150 may be dipped in a water resistant coating, or a water resistant coating may be sprayed on the external surfaces of the first connector portion 150. For example, if the first connector portion 150 is dipped or sprayed, a water resistant coating may form an external surface on each side of the first connector portion 150 (other than the surface having the first conical protrusion and the second conical protrusion). The first water resistant coating 160 may cover the surface of the first conductive layer 154 on which the conical protrusions are formed. For example, the first water resistant coating may cover areas of the surface between adjacent conical protrusions, such as the first conical protrusion 156 and the second conical protrusion 158. The first water resistant coating 160 may have a first thickness that is less than the height of the first conical protrusion 156 and/or the second conical protrusion 158. For example, the first thickness may be about 10-25 microns. In some embodiments, the height of the conical protrusions or surface features may be equal to or greater than double a thickness of the first water resistant coating 160 on the surface of the first conductive layer 154. The first connector portion 150 may include a first pressure sensitive adhesive layer 162 that is positioned adjacent to the first water resistant coating 160 on the surface of the first conductive layer 154. The first pressure sensitive adhesive layer 162 may have a second thickness that is equal to or less than the first thickness of the first water resistant coating 160. For example, the second thickness may be about 5-10 microns. In some embodiments, the height of the first conical protrusion 156 and/or other surface features may be at least double the first thickness and/or at least double a combined thickness of the first thickness and the second thickness. As a result, a tip of the first conical protrusion 156 and the second conical protrusion 158 may poke through the first water resistant coating 160 and the first pressure sensitive adhesive layer 162, or may otherwise be uncovered by either of the first water resistant layer and the first pressure sensitive adhesive layer 162.

The flexible circuit 170 may be a printed circuit board or other circuit and may be configured to engage with the first connector portion 150 and the second connector portion 180. The flexible circuit 170 may include a second substrate 172 having a first surface 174 and a second surface 176. The first surface 174 may be positioned opposite the second surface 176. The flexible circuit 170 may include a second conductive layer 178 that is laminated to the first surface 174, and a third conductive layer 180 mounted on or laminated to the second surface 176. The flexible circuit 170 may include a second water resistant coating 182 on the second conductive layer 178 and a third water resistant coating 184 on the third conductive layer 180. The flexible circuit 170 may optionally include a second pressure adhesive layer adjacent to the second water resistant coating 182 and a third pressure adhesive layer adjacent to the third water resistant coating 184. In some embodiments, the flexible circuit 170 may be dipped or sprayed with a water resistant material to form the water resistant coating. In some instances, a water resistant coating may form an external surface on each side of the flexible circuit other than the first surface and the second surface, where the pressure sensitive adhesive layers form external surfaces.

In a connected configuration, the conical portions or surface features of the first conductive layer 154, as well as the surface of the first conductive layer 154 in some embodiments, may be in contact with the second conductive layer 178 of the flexible circuit 170. As the first connector portion 150 and the flexible circuit 170 are pressed together, the surface features may contact and, in some instances, deform or puncture, the second conductive layer, thereby creating an electrical connection with low resistance and solid contact. The water resistant coating layers and/or pressure sensitive adhesive layers may flow and/or reflow or be otherwise displaced as the connector is connected. In some embodiments, the water resistant coating layer(s) and the pressure sensitive adhesive layer(s) may form a single layer that serves functions of both water resistance and sealing. As the first connector portion 150 and the flexible circuit 170 are pressed together, the respective water resistant coating layers and/or pressure sensitive adhesive layers on both the first connector portion 150 and the flexible circuit 170 may flow and surround the conical protrusions or surface features, as well as any other exposed conductive surfaces, so as to create a water resistant or waterproof barrier for the water resistant connector 150. Therefore, an interface between the first conductive layer 154 and the second conductive layer 178 may be covered with water resistant coating, while allowing an electrical connection to be established.

The second connector portion 190 may be substantially similar to, or the same as the first connector portion 150. In some embodiments, the second connector portion 190 may be a mirror image of the first connector portion 150. The second connector portion may be configured to engage the second side or second surface 176 of the flexible circuit 170. The second connector portion 190 may include a third substrate 192 and a fourth conductive layer 194 laminated to or otherwise attached to the third substrate 192. The fourth conductive layer 194 may include a surface having a third conical protrusion extending from the surface and a fourth conical protrusion extending from the surface. The second connector portion 190 may include a fourth water resistant coating 196 on the surface between the third conical protrusion and the fourth conical protrusion, and a fourth pressure sensitive adhesive layer 198 adjacent to the fourth water resistant coating 196.

The conical protrusions or other surface features of the second connector portion 190 may engage the third conductive layer 180 of the flexible circuit 170, for example, by contacting the third conductive layer 180, at least partially deforming the third conductive layer 180, puncturing the third conductive layer 180, and the like. In a connected configuration between the second connector portion 190 and the flexible circuit 140, an interface between the third conductive layer 180 and the fourth conductive layer 194 may be covered with water resistant coating.

In some embodiments, water resistant coating or water resistant coating layers may include encapsulation materials that are suspended in a solution (pre-cure) and/or dispersed in the water resistant coating layer (post-cure), where the capsules burst and release the encapsulation material during a connection process. The encapsulation material may be, in one example, a liquid water resistant material suspension configured to create a water resistant barrier when the capsules are broken.

While a zero insertion force water resistant connector 140 is illustrated in the example of FIG. 1, other embodiments may include a first connector having a first conductive layer and a first water resistant coating layer adjacent to the first conductive layer, and a circuit component having a second conductive layer positioned on a first side of the circuit component, and a second water resistant coating layer adjacent to the second conductive layer. The first conductive layer and the second conductive layer may be in contact in a connected configuration.

Example embodiments of the disclosure provide a number of technical features or technical effects. For example, in accordance with example embodiments of the disclosure, certain embodiments of the disclosure may create water resistant or waterproof barriers about electrical connection components for electronic devices. As a result, electrical connections can be established with additional water resistant or waterproof functionality, thereby extending or improving functionality of devices that use water resistant connectors. Design flexibility and lower cost may be achieved. The above examples of technical features and/or technical effects of example embodiments of the disclosure are merely illustrative and not exhaustive.

One or more illustrative embodiments of the disclosure have been described above. The above-described embodiments are merely illustrative of the scope of this disclosure and are not intended to be limiting in any way. Accordingly, variations, modifications, and equivalents of the embodiments disclosed herein are also within the scope of this disclosure. The above-described embodiments and additional and/or alternative embodiments of the disclosure will be described in detail hereinafter through reference to the accompanying drawings.

Illustrative Embodiments and Use Cases

Figure 2:
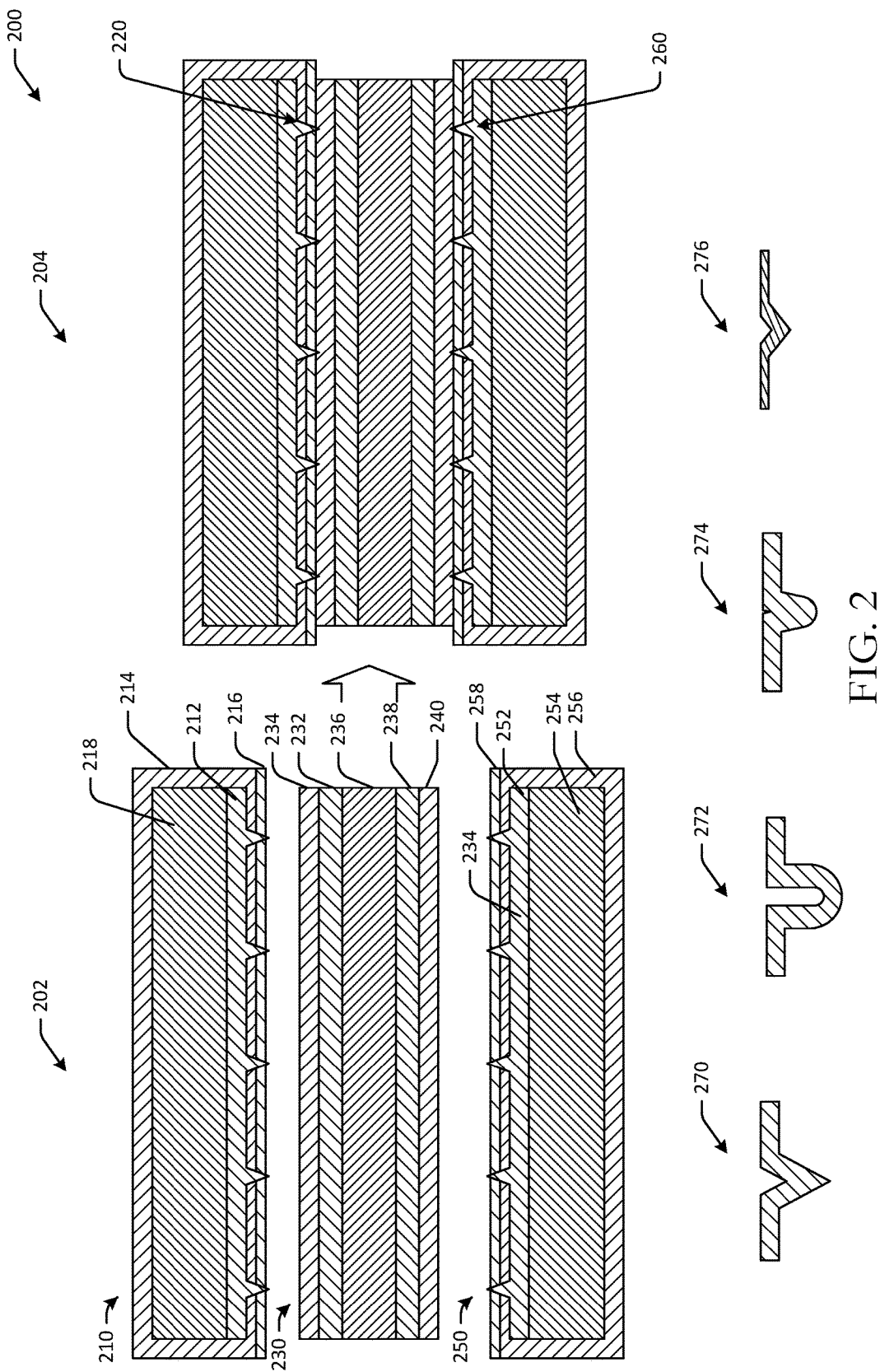
FIG. 2 is an example water resistant zero insertion force connector having conductive elements in accordance with one or more embodiments of the disclosure.

FIG. 2 schematically depicts an example water resistant zero insertion force connector 200 having conductive elements in accordance with one or more embodiments of the disclosure. The zero insertion force connector 200 is illustrated in a disconnected configuration 202 and a connected configuration 204. The zero insertion force connector 200 may include a first connector 210, a circuit component 230, and a second connector 250. The first connector 210 and the second connector 250 may engage opposite sides of the circuit component 230.

The first connector 210 may have a first conductive layer 212 and a first water resistant coating layer 214 adjacent to the first conductive layer 212. The first water resistant coating layer 214 may have a first thickness of between about 10 microns and about 25 microns. The first conductive layer 212 may be laminated to a circuit or substrate 218 that may be patterned with photolithography. The first connector 210 may include an optional first pressure sensitive adhesive layer 216 positioned adjacent to the first water resistant coating layer 214. The first pressure sensitive adhesive layer may have a second thickness that is less than the first thickness, such as between about 5 microns and about 10 microns, in one example.

The first connector 210 may include one or more surface features formed on the first conductive layer. The surface features may be asperities (e.g., rough edges on a surface, etc.), ridges, conical protrusions, rectangular protrusions, ridges, ripples, grooves, and the like that may be partially covered with the water resistant coating, but are substantially or wholly uncovered by any coating. The surface features may have a height that is about twice a height of the water resistant coating on the adjacent surface of the first conductive layer. In one example, surface features may include conical protrusions with cone half angles less than 45 degrees. Surface features may be formed by a subtractive process (e.g., etching, blasting, mechanical lathing, etching, laser etching, etc.) that removes material from parent metal, or may be formed by an additive process (e.g., plating, vacuum deposition, printing, etc.). If an additive process is used, the surface features may be formed from a material that is different than the material forming the conductive layer. Mechanical processes can also be used to form the surface features, such as stamping, forming, and the like.

An example subtractive process to form surface features may include creating a metal layer of full thickness, using a masking structure to protect the designated surface feature, and using a wet chemical edge to remove surrounding material. An example additive process may include using a vacuum deposition process to add material, or using a conductive ink or sintering process to add the surface features. Water resistant coating layers may be applied by a solution process, which may result in planarization of the coating, applying a film, which may result in uniform thickness, applying a spray, and the like.

In the example of FIG. 2, the first conductive layer 212 may have a first surface feature 220 formed on a surface of the first conductive layer 212. The first surface feature 220 may have a third thickness that is greater than a sum of the first thickness and the second thickness, such as between about 25 microns, or 30 microns, or another thickness or height. The height of the surface features can be modified to adjust a force needed to connect the first connector 210 to the circuit component 230. For example, an increase in height may reduce a necessary force to connect in some instances.

The circuit component 230 may have a second conductive layer 232 positioned on a first side of the circuit component 230, and a second water resistant coating layer 234 adjacent to the second conductive layer 232. In some embodiments, a pressure sensitive adhesive layer may be adjacent to the second water resistant coating layer 234. The first conductive layer 212 and the second conductive layer 232 may be at least partially in contact in the connected configuration 204. The second conductive layer 232 may be attached to a circuit or other component 236 of the circuit component 230. The first surface feature 220 of the first connector 210 may be in contact with the second conductive layer 232 of the circuit component 230 in the connected configuration 204. For example, the first surface feature 220 may puncture, or at least partially deform, the second conductive layer 232 in some embodiments. Therefore, a solid electrical connection may be created.

The circuit component 230 may include a third conductive layer 238 positioned on a second side of the circuit component 230, as well as a third water resistant coating layer 240 adjacent to the third conductive layer 238. The circuit component 230 may include an optional pressure sensitive adhesive layer that may be adjacent to the third water resistant coating layer 240.

The second connector 250 may engage the second side and/or the third conductive layer 238 of the circuit component 230 in the connected configuration 204. The second connector 250 may include a fourth conductive layer 252 mounted to a circuit 254 or other substrate, as well as a third water resistant coating layer 256 adjacent to the fourth conductive layer 252 and an optional second pressure sensitive adhesive layer 258 adjacent to the third water resistant coating layer 256. The third water resistant coating layer 256 may be only along the third conductive layer 238 in some embodiments, while in other embodiments, the third water resistant coating layer 256 may be surrounding a portion, or all, of the second connector 250, such as depicted in FIG. 2. For example, the second connector 250 may be dipped in a water resistant coating solution in some instances. The second connector 250 may include a second surface feature 260 formed on a surface of the fourth conductive layer 252. The second surface feature 260 and the third conductive layer 238 may be in contact in the connected configuration 204. For example, the second surface feature 260 may be a cone or spike (or any other geometry that may have a relatively sharp tips) that pushes through the water resistant coating layers and/or pressure sensitive adhesive layers and contacts the corresponding conductive layer 238 on the circuit component 230. The conductive layers may be, for example, copper or aluminum foil layers.

The surface features may have any suitable geometry. Dimensions of the surface features, as well as tip geometry, may affect a force needed to connect the water resistant connector 200. For example, a first example geometry 270 of a surface feature is a V-shaped surface feature with a relatively sharp tip. Such geometry may reduce an amount of force needed to create contact between conductive layers. A second example geometry 272 includes a substantially U-shaped surface feature that may increase a surface area of contact between adjacent conductive layers. A third example geometry 274 includes a U-shaped surface feature with a reduced height that may increase an overall force needed to create electrical contact, and a fourth example geometry 276 includes a V-shaped surface feature with a reduced height that may displace a reduced amount of water resistant coating and/or pressure sensitive adhesive material in a connected configuration. Other geometries and dimensions can be used.

In the connected configuration 204, the opposing water resistant films or coating layers may come into contact and may reflow or bond through the pressure sensitive adhesive layers to provide an improved water barrier.

In some embodiments, the circuit component 230 and/or the first connector 210 and the second connector 250 may be coated with a water resistant material or water resistant film. The water resistant coating may be vacuum deposited, dipped, sprayed, or applied in a suitable manner Example water resistant materials may include hydrocarbon, fluoropolymer, acrylic, an inorganic material, a combination of materials, or other materials. Different processing and material preparation techniques that can be used may result in uniform thickness of coatings, planarizing of coatings, and the like. Certain embodiments may be formed with liquid coatings. Water resistant coating layers and/or pressure sensitive adhesive layers may be treated with sprays, dips, slow coats, etc., and may be air dried, thermally cured, UV cured, hybrid cured (e.g., B-stage, etc.), and the like for various textures and functionality of connectors.

In some embodiments, the respective water resistant coating layers and the pressure sensitive adhesive layers may be combined or may otherwise form a single layer. For example, in FIG. 2, the first pressure sensitive adhesive layer 216 and the first water resistant coating layer 214 may form a single partially cured layer. A partially cured layer may be a B-staged layer. For example, the layer may be an epoxy resin that is pre-dried after being applied onto a surface. The B-staged layer may later be completely cured under heat and/or pressure.

Figure 3:
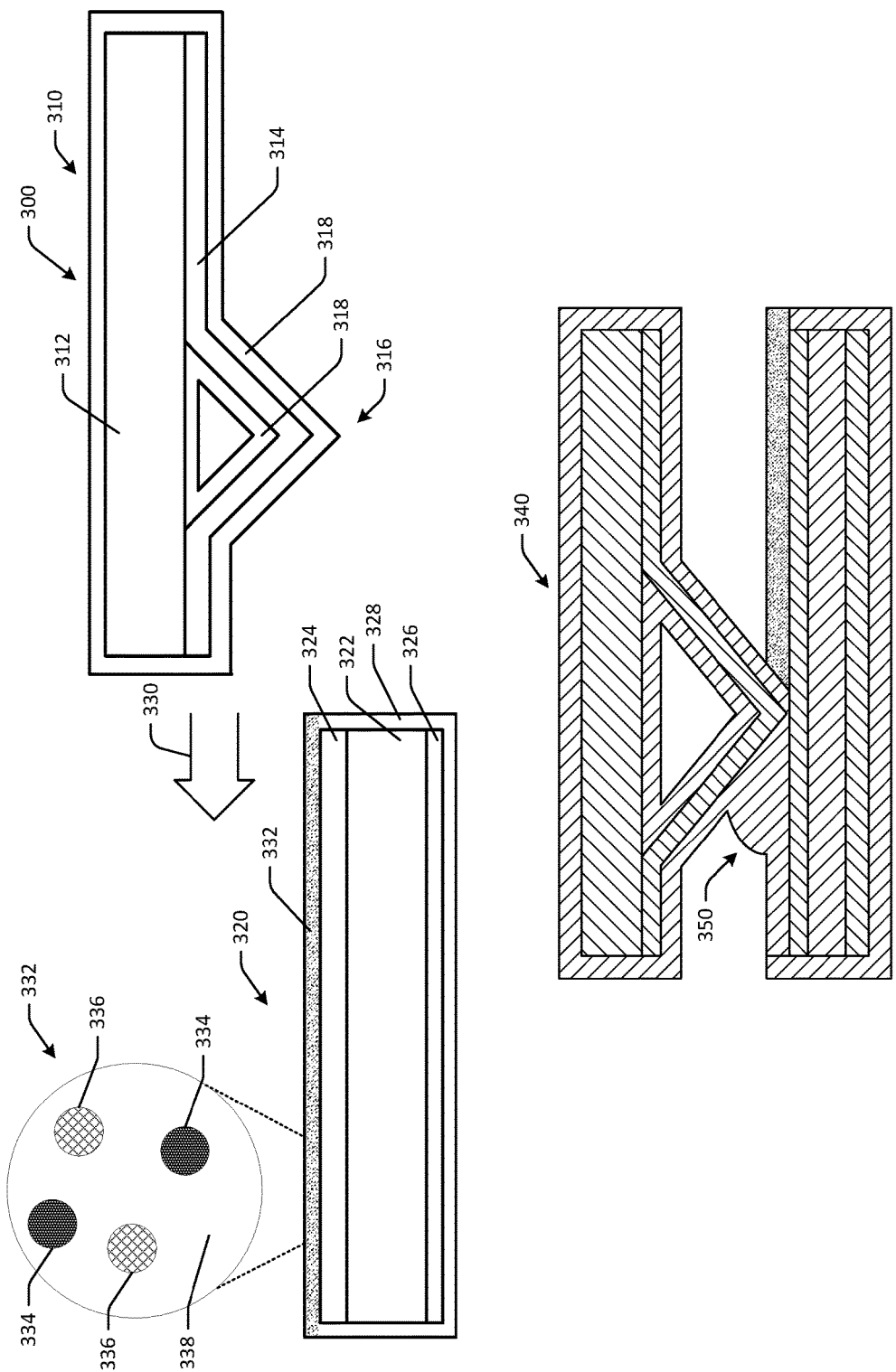
FIG. 3 is an example water resistant board-to-board connector having conductive elements in accordance with one or more embodiments of the disclosure.

FIG. 3 schematically depicts an example water resistant board-to-board connector 300 having conductive elements in accordance with one or more embodiments of the disclosure. The board-to-board connector 300 may be exposed to an ambient environment of the mobile device or device that includes the connector 300, and may therefore potentially be exposed to liquids. The example board-to-board connector 300 may include a first portion 310 that slideably engages a second portion 320. For example, in FIG. 3, the first portion 310 may slide in the illustrated direction 330 (left in the example of FIG. 3) to engage the second portion 320.

The first portion 310 may be a board-to-board female portion and may include a circuit or a substrate 312 and a first conductive layer 314 laminated to, or otherwise attached to, the substrate 312. The first conductive layer 314 may be formed or bent in a V-like shape or bent configuration 316, as illustrated in FIG. 3, so as to bias toward an electrical connection with a conductive layer of the second portion 320. The first portion 310 may be covered in a water resistant coating 318. For example, the first portion 310 may be dipped in a water resistant solution. Therefore, the water resistant coating may be found on some or all external surfaces and/or internal surfaces of the first portion 310, including, for example, the triangle-shaped portion of the first portion 310 created by the bent section of the first conductive layer 314. The water resistant coating may therefore at least partially cover an internal (or external) surface of the first conductive layer 314, as illustrated in FIG. 3.

The second portion 320 may be a board-to-board male portion and may include a circuit or substrate 322. A second conductive layer 324 may be laminated to, or otherwise mounted on, a first side of the substrate 322. A third conductive layer 326 may be laminated to, or otherwise mounted on, a second side of the substrate 322. The second conductive layer 324 and/or the third conductive layer 326 may be formed in a planar or substantially planar configuration. The second portion 320 may include a water resistant coating 328 around one or more external surfaces of the second portion 320. For example, the second portion 320 may be dipped or sprayed with a water resistant solution or material.

In some embodiments, the second portion 320 may include more than one type of water resistant coating, whereas in other embodiments, the external surfaces of the second portion 320 may be covered in a single type of water resistant coating. For example, in FIG. 3, a first type of water resistant coating 328 may be used on certain surfaces of the second portion, while a second type of water resistant coating 332 may be used on the surface of the second conductive layer 324, which is the layer configured to engage the first conductive layer 314 of the first portion 310.

The second type of water resistant coating 332 may be a solution (e.g., pre-curing, etc.) or film (e.g., post-curing, etc.) with capsules of material, or encapsulation material, suspended in or dispersed throughout the solution or film. The encapsulation material may be reactive or non-reactive, and may be in liquid or semi-solid form. The encapsulation material may be released when the capsule carrying the material is ruptured or burst, such as after the first portion 310 is connected to the second portion 320, thereby creating a track or a path in the second type of water resistant coating 332 during the lateral movement of the connection process. For example, when the first portion 310 and the second portion 320 are connected, at least a portion of the second water resistant coating layer 332 may be laterally displaced in the connected configuration. At least a portion of the encapsulation material may be released in the connected configuration. In some embodiments, capsules may be preformed, in that the encapsulation material is contained in a housing or shell, while in other embodiments, capsules may be solidified and/or dispersed without external housings or shells.

The encapsulation material(s) may be non-reactive or reactive. For example, the encapsulation material may be the same in each capsule, in some embodiments. In other embodiments, the encapsulation materials may include different materials that may react with each other or the material of the film. The encapsulation materials may be the same material as the solution or film in which the capsules are suspended or dispersed (e.g., the same water resistant coating except in a liquid form, etc.), or may be one or more materials that are reactive with either or both the water resistant coating material and/or the material(s) in the other capsules. For example, the second water resistant coating layer 332 may include a first encapsulation material 334 and a second encapsulation material 336 that are configured to react with each other and/or a material 338 of the water resistant coating layer 332 to create a water resistant barrier.

Therefore, when the capsules rupture as a result of the first portion 310 sliding across the surface of the second portion 320, the encapsulation material is released and causes a water resistant barrier to be created in the path of the first portion, while allowing the first conductive layer 314 to create a solid electrical connection with the second conductive layer 324.

In some embodiments, the second water resistant coating layer 332 may include a film having a first material, where the encapsulation material has a second material configured to react with the first material to form a water resistant barrier. Other embodiments may include encapsulation materials that react with other encapsulation materials. In other embodiments, the materials may be homogenous. In other embodiments, the materials may be in different states, such as the film having a first material in solid form, and the encapsulation material having the first material in liquid form. Examples of encapsulation materials may include a fluoropolymer dissolved in a solvent that dries to form a film, two components that spontaneously react like polyol and isocyanate to form polyurethane, a two part epoxy, polyacids and polyols, and the like. The encapsulation material may form about 50%, or less than about 50%, or about 30%, of the second water resistant coating layer 332. In embodiments where multiple encapsulation materials are used, the respective capsules may have a 1:1 stoichiometry.

In a connected configuration 340, the bent portion 316 of the first portion 310 may behave like a bent for low resistance ohm contact between the first portion 310 and the second portion 320. As the first portion 310 slides across the second conductive layer 324, the encapsulation material in the second water resistant coating layer 332 bursts and creates a water resistant barrier in the path or track created by the first conductive layer 314 of the first portion. A portion 350 of the second water resistant coating layer 332 may be dragged or pushed by the bent portion 316 of the first conductive layer 314. The released liquid or material flows around the bent of the first conductive layer and creates a self-healing water resistant barrier. The second water resistant coating layer 332 may have an initial thickness that is about twice or three times a desired thickness after the connector is in the connected configuration 340. For example, an initial thickness may be about 30-75 microns, whereas in the connected configuration 340, the thickness of the remaining water resistant coating layer may be about 10-25 microns thick. In some embodiments, the material released from the capsules may be cured by air or by a chemical process to create the water resistant layer or film.

Figure 4:
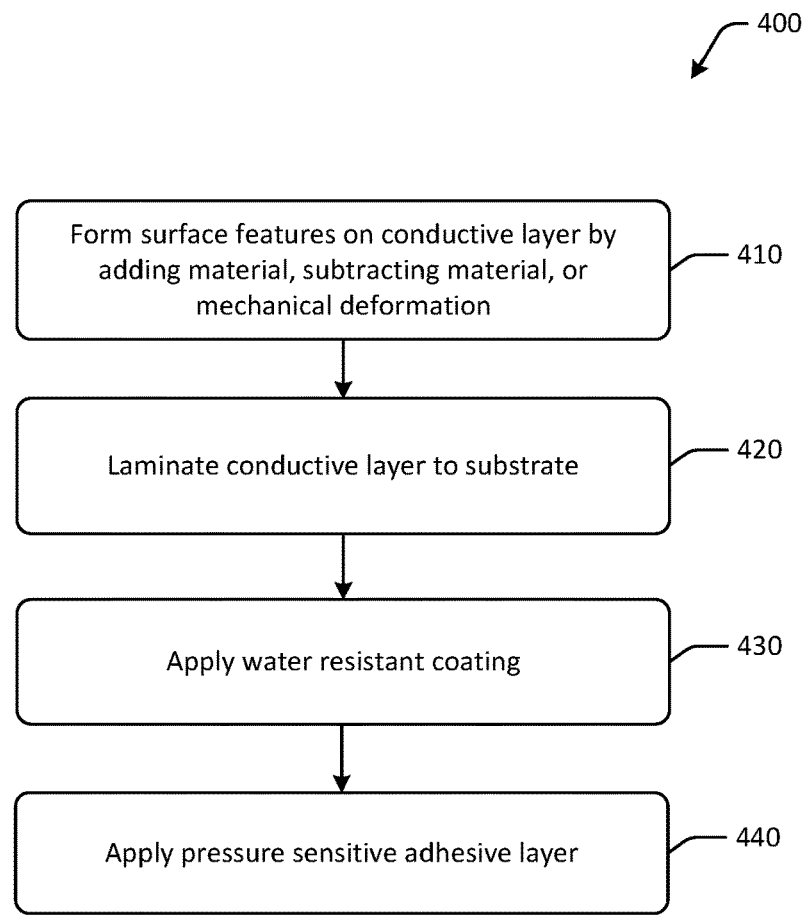
FIG. 4 is an example process flow for manufacturing a water resistant connector having conductive elements in accordance with one or more embodiments of the disclosure.

Referring to FIG. 4, an example process flow 400 for manufacturing a water resistant connector having conductive elements is depicted in accordance with one or more embodiments of the disclosure. The process flow 400 may be used, in one example, to create a component of a water resistant connector having conductive elements. While FIG. 4 includes a number of operations, some embodiments may include additional or fewer operations.

At block 410 of the process flow 400, surface features may be formed on a conductive layer by adding material, subtracting material, or mechanical deformation. For example, surface features can be added to a conductive material via vacuum depositing processes and the like. The added material may be the same or a different material than the base material. In another example, surface features can be created on a conductive material via removing material, such as by etching or mechanically cutting the material, and the like. In another example, surface features can be created on a conductive material via mechanical deformation of the material, such as stamping, bending, and the like.

At block 420 of the process flow 400, the conductive layer may be laminated to the circuit or substrate. At block 430, a water resistant coating may be applied, for example, by spray, dipping, solution processing, applying a film, and the like. At block 440, a pressure sensitive adhesive layer may be applied to a portion of the connector that includes the surface features. The connector may be used as part of a water resistant connector.

One or more operations of the methods, process flows, or use cases of FIGS. 1-4 may have been described above as being performed by a user device, or more specifically, by one or more program module(s), applications, or the like executing on a device. It should be appreciated, however, that any of the operations of the methods, process flows, or use cases of FIGS. 1-4 may be performed, at least in part, in a distributed manner by one or more other devices, or more specifically, by one or more program module(s), applications, or the like executing on such devices. While the operations of the methods, process flows, or use cases of FIGS. 1-4 may be described in the context of the illustrative devices, it should be appreciated that such operations may be implemented in connection with numerous other device configurations.

The operations described and depicted in the illustrative methods, process flows, and use cases of FIGS. 1-4 may be carried out or performed in any suitable order, such as the depicted orders, as desired in various example embodiments of the disclosure. Additionally, in certain example embodiments, at least a portion of the operations may be carried out in parallel. Furthermore, in certain example embodiments, less, more, or different operations than those depicted in FIGS. 1-4 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by the execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Illustrative Computer Architecture

Figure 5:
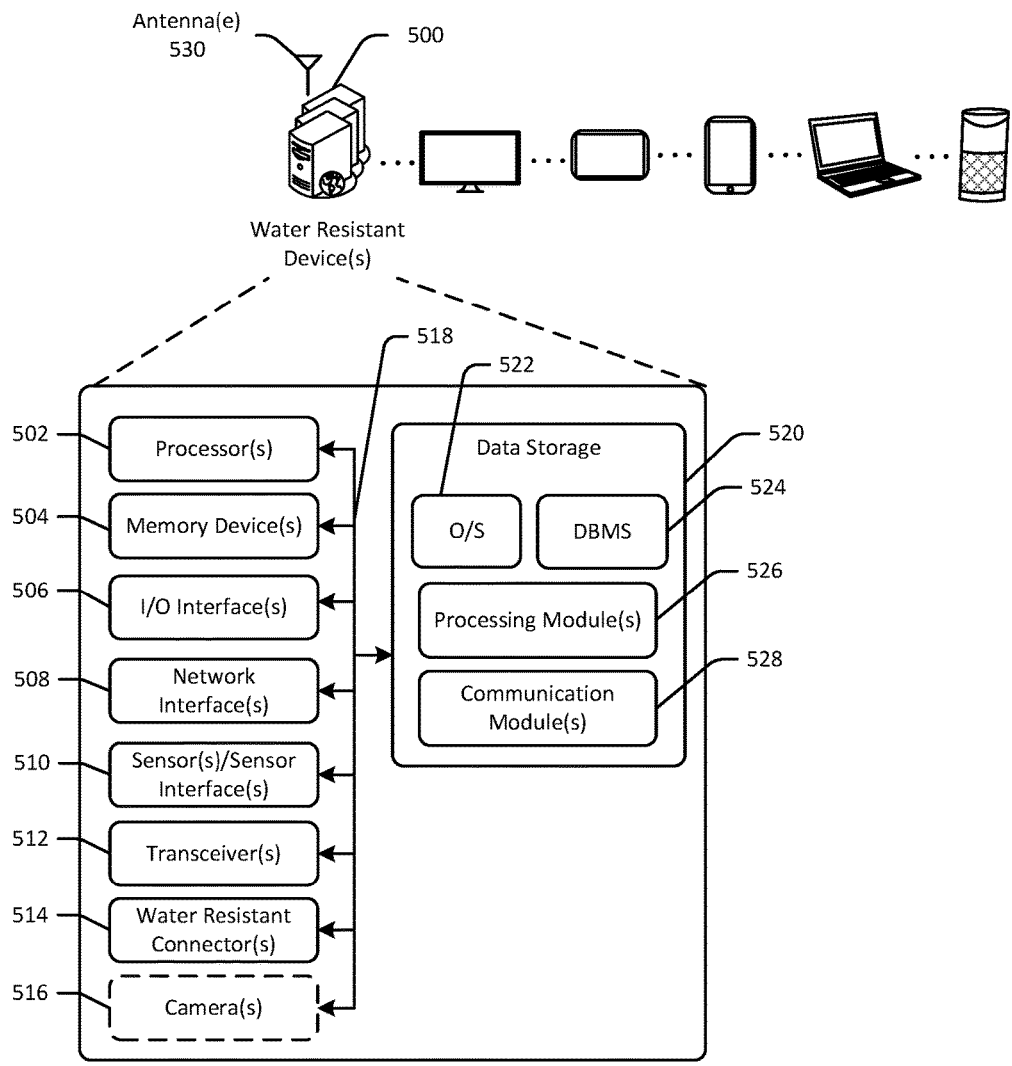
FIG. 5 schematically illustrates an example architecture of a water resistant electronic device in accordance with one or more embodiments of the disclosure.

FIG. 5 is a schematic block diagram of one or more illustrative water resistant device(s) 500 in accordance with one or more example embodiments of the disclosure. The water resistant device(s) 500 may include any suitable computing device including, but not limited to, a server system, a mobile device such as a smartphone, a tablet, an e-reader, a wearable device, or the like; a desktop computer; a laptop computer; a content streaming device; a set-top box; a scanning device; a barcode scanning wand; a drone; or the like. The water resistant device(s) 500 may correspond to an illustrative device configuration for the scanning device of FIGS. 1-4.

The water resistant device(s) 500 may be configured to communicate with one or more servers, user devices, or the like. The water resistant device(s) 500 may be configured to determine product identifiers, scan or decode barcodes, read product identifiers, trigger purchases or orders, reorder products, process digital and analog signals, deliver products, present content, and other operations.

The water resistant device(s) 500 may be configured to communicate via one or more networks. Such network(s) may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Further, such network(s) may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

In an illustrative configuration, the water resistant device(s) 500 may include one or more processors (processor(s)) 502, one or more memory devices 504 (also referred to herein as memory 504), one or more input/output (I/O) interface(s) 506, one or more network interface(s) 508, one or more sensor(s) or sensor interface(s) 510, one or more transceiver(s) 512, one or more water resistant connector(s) 514, one or more optional camera(s) 516, and data storage 520. The water resistant device(s) 500 may further include one or more bus(es) 518 that functionally couple various components of the water resistant device(s) 500. The water resistant device(s) 500 may further include one or more antenna(e) 530 that may include, without limitation, a cellular antenna for transmitting or receiving signals to/from a cellular network infrastructure, an antenna for transmitting or receiving Wi-Fi signals to/from an access point (AP), a Global Navigation Satellite System (GNSS) antenna for receiving GNSS signals from a GNSS satellite, a Bluetooth antenna for transmitting or receiving Bluetooth signals, a Near Field Communication (NFC) antenna for transmitting or receiving NFC signals, and so forth. These various components will be described in more detail hereinafter.

The bus(es) 518 may include at least one of a system bus, a memory bus, an address bus, or a message bus, and may permit the exchange of information (e.g., data (including computer-executable code), signaling, etc.) between various components of the water resistant device(s) 500. The bus(es) 518 may include, without limitation, a memory bus or a memory controller, a peripheral bus, an accelerated graphics port, and so forth. The bus(es) 518 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnect (PCI) architecture, a PCI-Express architecture, a Personal Computer Memory Card International Association (PCMCIA) architecture, a Universal Serial Bus (USB) architecture, and so forth.

The memory 504 of the water resistant device(s) 500 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 504 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 504 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 520 may include removable storage and/or non-removable storage including, but not limited to, magnetic storage, optical disk storage, and/or tape storage. The data storage 520 may provide non-volatile storage of computer-executable instructions and other data. The memory 504 and the data storage 520, removable and/or non-removable, are examples of computer-readable storage media (CRSM) as that term is used herein.

The data storage 520 may store computer-executable code, instructions, or the like that may be loadable into the memory 504 and executable by the processor(s) 502 to cause the processor(s) 502 to perform or initiate various operations. The data storage 520 may additionally store data that may be copied to the memory 504 for use by the processor(s) 502 during the execution of the computer-executable instructions. Moreover, output data generated as a result of execution of the computer-executable instructions by the processor(s) 502 may be stored initially in the memory 504, and may ultimately be copied to the data storage 520 for non-volatile storage.

More specifically, the data storage 520 may store one or more operating systems (O/S) 522; one or more database management systems (DBMS) 524; and one or more program module(s), applications, engines, computer-executable code, scripts, or the like such as, for example, one or more processing module(s) 526 and/or one or more communication module(s) 528. Some or all of these module(s) may be sub-module(s). Any of the components depicted as being stored in the data storage 520 may include any combination of software, firmware, and/or hardware. The software and/or firmware may include computer-executable code, instructions, or the like that may be loaded into the memory 504 for execution by one or more of the processor(s) 502. Any of the components depicted as being stored in the data storage 520 may support functionality described in reference to corresponding components named earlier in this disclosure.

The data storage 520 may further store various types of data utilized by the components of the water resistant device(s) 500. Any data stored in the data storage 520 may be loaded into the memory 504 for use by the processor(s) 502 in executing computer-executable code. In addition, any data depicted as being stored in the data storage 520 may potentially be stored in one or more datastore(s) and may be accessed via the DBMS 524 and loaded in the memory 504 for use by the processor(s) 502 in executing computer-executable code. The datastore(s) may include, but are not limited to, databases (e.g., relational, object-oriented, etc.), file systems, flat files, distributed datastores in which data is stored on more than one node of a computer network, peer-to-peer network datastores, or the like.

The processor(s) 502 may be configured to access the memory 504 and execute the computer-executable instructions loaded therein. For example, the processor(s) 502 may be configured to execute the computer-executable instructions of the various program module(s), applications, engines, or the like of the water resistant device(s) 500 to cause or facilitate various operations to be performed in accordance with one or more embodiments of the disclosure. The processor(s) 502 may include any suitable processing unit capable of accepting data as input, processing the input data in accordance with stored computer-executable instructions, and generating output data. The processor(s) 502 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 502 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 502 may be capable of supporting any of a variety of instruction sets.

Referring now to functionality supported by the various program module(s) depicted in FIG. 5, the processing module(s) 526 may include computer-executable instructions, code, or the like that responsive to execution by one or more of the processor(s) 502 may perform functions including, but not limited to, controlling operation of the device, presenting content, causing wireless communications, and the like.

The communication module(s) 528 may include computer-executable instructions, code, or the like that responsive to execution by one or more of the processor(s) 502 may perform functions including, but not limited to, sending and/or receiving data, including content, sending and/or receiving instructions and commands, and the like.

Referring now to other illustrative components depicted as being stored in the data storage 520, the O/S 522 may be loaded from the data storage 520 into the memory 504 and may provide an interface between other application software executing on the water resistant device(s) 500 and the hardware resources of the water resistant device(s) 500. More specifically, the O/S 522 may include a set of computer-executable instructions for managing the hardware resources of the water resistant device(s) 500 and for providing common services to other application programs (e.g., managing memory allocation among various application programs). In certain example embodiments, the O/S 522 may control execution of the other program module(s). The O/S 522 may include any operating system now known or which may be developed in the future including, but not limited to, any server operating system, any mainframe operating system, or any other proprietary or non-proprietary operating system.

The DBMS 524 may be loaded into the memory 504 and may support functionality for accessing, retrieving, storing, and/or manipulating data stored in the memory 504 and/or data stored in the data storage 520. The DBMS 524 may use any of a variety of database models (e.g., relational model, object model, etc.) and may support any of a variety of query languages. The DBMS 524 may access data represented in one or more data schemas and stored in any suitable data repository including, but not limited to, databases (e.g., relational, object-oriented, etc.), file systems, flat files, distributed datastores in which data is stored on more than one node of a computer network, peer-to-peer network datastores, or the like. In those example embodiments in which the water resistant device(s) 500 is a mobile device, the DBMS 524 may be any suitable lightweight DBMS optimized for performance on a mobile device.

Referring now to other illustrative components of the water resistant device(s) 500, the input/output (I/O) interface(s) 506 may facilitate the receipt of input information by the water resistant device(s) 500 from one or more I/O devices as well as the output of information from the water resistant device(s) 500 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the water resistant device(s) 500 or may be separate. The I/O devices may further include, for example, any number of peripheral devices such as data storage devices, printing devices, and so forth.

The I/O interface(s) 506 may also include an interface for an external peripheral device connection such as universal serial bus (USB), FireWire, Thunderbolt, Ethernet port or other connection protocol that may connect to one or more networks. The I/O interface(s) 506 may also include a connection to one or more of the antenna(e) 530 to connect to one or more networks via a wireless local area network (WLAN) (such as Wi-Fi) radio, Bluetooth, ZigBee, and/or a wireless network radio, such as a radio capable of communication with a wireless communication network such as a Long Term Evolution (LTE) network, WiMAX network, 3G network, a ZigBee network, etc.

The water resistant device(s) 500 may further include one or more network interface(s) 508 via which the water resistant device(s) 500 may communicate with any of a variety of other systems, platforms, networks, devices, and so forth. The network interface(s) 508 may enable communication, for example, with one or more wireless routers, one or more host servers, one or more web servers, and the like via one or more networks.

The antenna(e) 530 may include any suitable type of antenna depending, for example, on the communications protocols used to transmit or receive signals via the antenna (e) 530. Non-limiting examples of suitable antennae may include directional antennae, non-directional antennae, dipole antennae, folded dipole antennae, patch antennae, multiple-input multiple-output (MIMO) antennae, or the like. The antenna(e) 530 may be communicatively coupled to one or more transceivers 512 or radio components to which or from which signals may be transmitted or received.

As previously described, the antenna(e) 530 may include a cellular antenna configured to transmit or receive signals in accordance with established standards and protocols, such as Global System for Mobile Communications (GSM), 3G standards (e.g., Universal Mobile Telecommunications System (UMTS), Wideband Code Division Multiple Access (W-CDMA), CDMA2000, etc.), 4G standards (e.g., Long-Term Evolution (LTE), WiMax, etc.), direct satellite communications, or the like.

The antenna(e) 530 may additionally, or alternatively, include a Wi-Fi antenna configured to transmit or receive signals in accordance with established standards and protocols, such as the IEEE 802.11 family of standards, including via 2.4 GHz channels (e.g., 802.11b, 802.11g, 802.11n), 5 GHz channels (e.g., 802.11n, 802.11ac), or 60 GHz channels (e.g., 802.11ad). In alternative example embodiments, the antenna(e) 530 may be configured to transmit or receive radio frequency signals within any suitable frequency range forming part of the unlicensed portion of the radio spectrum.

The antenna(e) 530 may additionally, or alternatively, include a GNSS antenna configured to receive GNSS signals from three or more GNSS satellites carrying time-position information to triangulate a position therefrom. Such a GNSS antenna may be configured to receive GNSS signals from any current or planned GNSS such as, for example, the Global Positioning System (GPS), the GLONASS System, the Compass Navigation System, the Galileo System, or the Indian Regional Navigational System.

The transceiver(s) 512 may include any suitable radio component(s) for—in cooperation with the antenna(e) 530—transmitting or receiving radio frequency (RF) signals in the bandwidth and/or channels corresponding to the communications protocols utilized by the water resistant device(s) 500 to communicate with other devices. The transceiver(s) 512 may include hardware, software, and/or firmware for modulating, transmitting, or receiving—potentially in cooperation with any of antenna(e) 530—communications signals according to any of the communications protocols discussed above including, but not limited to, one or more Wi-Fi and/or Wi-Fi direct protocols, as standardized by the IEEE 802.11 standards, one or more non-Wi-Fi protocols, or one or more cellular communications protocols or standards. The transceiver(s) 512 may further include hardware, firmware, or software for receiving GNSS signals. The transceiver(s) 512 may include any known receiver and baseband suitable for communicating via the communications protocols utilized by the water resistant device(s) 500. The transceiver(s) 512 may further include a low noise amplifier (LNA), additional signal amplifiers, an analog-to-digital (A/D) converter, one or more buffers, a digital baseband, or the like.

The sensor(s)/sensor interface(s) 510 may include or may be capable of interfacing with any suitable type of sensing device such as, for example, inertial sensors, force sensors, thermal sensors, photocells, and so forth. Example types of inertial sensors may include accelerometers (e.g., MEMS-based accelerometers), gyroscopes, and so forth.

The water resistant connector(s) 514 may be any connector configured to prevent entry of water and/or to protect conductive elements from water exposure and/or ingress. The camera(s) 516 may be any device configured to receive analog sound input or voice data, image data, and the like.

It should be appreciated that the program module(s), applications, computer-executable instructions, code, or the like depicted in FIG. 5 as being stored in the data storage 520 are merely illustrative and not exhaustive and that processing described as being supported by any particular module may alternatively be distributed across multiple module(s) or performed by a different module. In addition, various program module(s), script(s), plug-in(s), Application Programming Interface(s) (API(s)), or any other suitable computer-executable code hosted locally on the water resistant device(s) 500, and/or hosted on other computing device(s) accessible via one or more networks, may be provided to support functionality provided by the program module(s), applications, or computer-executable code depicted in FIG. 5 and/or additional or alternate functionality. Further, functionality may be modularized differently such that processing described as being supported collectively by the collection of program module(s) depicted in FIG. 5 may be performed by a fewer or greater number of module(s), or functionality described as being supported by any particular module may be supported, at least in part, by another module. In addition, program module(s) that support the functionality described herein may form part of one or more applications executable across any number of systems or devices in accordance with any suitable computing model such as, for example, a client-server model, a peer-to-peer model, and so forth. In addition, any of the functionality described as being supported by any of the program module(s) depicted in FIG. 5 may be implemented, at least partially, in hardware and/or firmware across any number of devices.

It should further be appreciated that the water resistant device(s) 500 may include alternate and/or additional hardware, software, or firmware components beyond those described or depicted without departing from the scope of the disclosure. More particularly, it should be appreciated that software, firmware, or hardware components depicted as forming part of the water resistant device(s) 500 are merely illustrative and that some components may not be present or additional components may be provided in various embodiments. While various illustrative program module(s) have been depicted and described as software module(s) stored in the data storage 520, it should be appreciated that functionality described as being supported by the program module(s) may be enabled by any combination of hardware, software, and/or firmware. It should further be appreciated that each of the above-mentioned module(s) may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other module(s). Further, one or more depicted module(s) may not be present in certain embodiments, while in other embodiments, additional module(s) not depicted may be present and may support at least a portion of the described functionality and/or additional functionality. Moreover, while certain module(s) may be depicted and described as sub-module(s) of another module, in certain embodiments, such module(s) may be provided as independent module(s) or as sub-module(s) of other module(s).

One or more operations of the methods, process flows, and use cases of FIGS. 1-4 may be performed by a device having the illustrative configuration depicted in FIG. 5, or more specifically, by one or more engines, program module(s), applications, or the like executable on such a device. It should be appreciated, however, that such operations may be implemented in connection with numerous other device configurations.

The operations described and depicted in the illustrative methods and process flows of FIGS. 1-4 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIGS. 1-4 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Program module(s), applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program module(s), or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

That which is claimed is:
1. A water resistant connector comprising:
   a first connector portion comprising:
      a first substrate;
      a first conductive layer disposed on the first substrate, wherein the first conductive layer comprises a surface having a first conical protrusion extending from the surface and a second conical protrusion extending from the surface;

a first water resistant layer disposed on the surface between the first conical protrusion and the second conical protrusion, the first water resistant layer having a first thickness; and a first pressure sensitive adhesive layer adjacent to the first water resistant layer;

wherein a height of the first conical protrusion is at least double the first thickness; and a flexible circuit, wherein the first connector portion is configured to engage the flexible circuit, the flexible circuit comprising:

a second substrate having a first surface and a second surface;

a second conductive layer disposed on the first surface;

a third conductive layer disposed on the second surface;

a second water resistant layer disposed on the second conductive layer;

a third water resistant layer on the third conductive layer;

a second pressure adhesive layer adjacent to the second water resistant layer; and a third pressure adhesive layer adjacent to the third water resistant layer;

wherein the first conical protrusion and the second conical protrusion puncture the second water resistant layer and the second pressure adhesive layer in a mated configuration of the water resistant connector, and wherein the first conical protrusion and the second conical protrusion at least partially deform the second conductive layer in the mated configuration, such that an interface between the first conductive layer and the second conductive layer is covered with water resistant material.

2. The water resistant connector of claim 1, wherein the third water resistant layer comprises a plurality of capsules, the plurality of capsules comprising a water resistant material configured to create a water resistant barrier when the plurality of capsules are broken.

3. The water resistant connector of claim 1, wherein the third water resistant layer comprises a plurality of capsules, the plurality of capsules comprising a first set of capsules having a first material and a second set of capsules having a second material, wherein the first material and the second material react to each other to create a water resistant barrier when the plurality of capsules are broken.

4. The water resistant connector of claim 1, wherein a second water resistant layer merges with the first water resistant layer to form an external surface on each side of the first connector portion; and wherein a fourth water resistant layer merges with the second water resistant layer and the third water resistant layer to form an external surface on each side of the flexible circuit.

5. A water resistant connector comprising:

a first connector comprising a first conductive layer, a first water resistant layer adjacent to the first conductive layer, a first pressure sensitive adhesive layer adjacent to the first water resistant layer, and a first surface feature formed on a surface of the first conductive layer; and a circuit component comprising a second conductive layer positioned on a first side of the circuit component, and a second water resistant layer adjacent to the second conductive layer;

wherein the first conductive layer and the second conductive layer are in contact in a connected configuration.

6. The water resistant connector of claim 5, wherein the first water resistant layer has a first thickness, the first pressure sensitive adhesive layer has a second thickness that is less than the first thickness, and the first surface feature has a third thickness that is greater than a sum of the first thickness and the second thickness, and wherein the first surface feature is in contact with the second conductive layer in the connected configuration.

7. The water resistant connector of claim 6, wherein the circuit component further comprises a third conductive layer positioned on a second side of the circuit component, the water resistant connector further comprising:

a second connector comprising a fourth conductive layer, a third water resistant layer adjacent to the fourth conductive layer, a second pressure sensitive adhesive layer adjacent to the third water resistant layer, and a second surface feature formed on a surface of the fourth conductive layer;

wherein the second surface feature and the third conductive layer are in contact in the connected configuration.

8. The water resistant connector of claim 6, wherein the first surface feature punctures or at least partially deforms the second conductive layer.

9. The water resistant connector of claim 6, wherein the first pressure sensitive adhesive layer and the first water resistant layer form a single layer.

10. The water resistant connector of claim 6, wherein the first water resistant layer comprises a first encapsulation material and a second encapsulation material that are configured to chemically react to create a water resistant barrier.

11. The water resistant connector of claim 5, wherein the first conductive layer is formed in a bent configuration, and the second conductive layer is formed in a planar configuration; and wherein at least a portion of the second water resistant layer is laterally displaced in the connected configuration.

12. The water resistant connector of claim 11, wherein the second water resistant layer comprises an encapsulation material, and wherein at least a portion of the encapsulation material is released in the connected configuration.

13. The water resistant connector of claim 12, wherein the matrix solution comprises a first material, and wherein the encapsulation material comprises a second material configured to react with the first material to form a water resistant barrier.

14. The water resistant connector of claim 12, wherein the matrix solution comprises a first material in solid form, and wherein the encapsulation material comprises the first material in liquid form.

15. The water resistant connector of claim 12, wherein the second water resistant layer comprises multiple encapsulation materials that form less than 50% of the second water resistant layer, and wherein the multiple materials have a 1:1 stoichiometry.

16. A mobile device comprising:

at least one memory that stores computer-executable instructions;

at least one processor configured to access the at least one memory and execute the computer-executable instructions; and a water resistant connector comprising:
- a first connector comprising a first conductive layer formed in a bent configuration and a first water resistant layer adjacent to the first conductive layer; and
- a circuit component comprising a second conductive layer positioned on a first side of the circuit component, and a second water resistant layer adjacent to the second conductive layer;
- wherein the first conductive layer and the second conductive layer are in contact in a connected configuration, and at least a portion of the second water resistant layer is laterally displaced in the connected configuration.

17. The mobile device of claim 16, wherein the second water resistant layer comprises a first encapsulation material dispersed in the second water resistant layer, and wherein at least a portion of the first encapsulation material is released in the connected configuration.

18. The mobile device of claim 17, wherein the first encapsulation material comprises a first material, and wherein the second water resistant layer further comprises a second encapsulation material having a second material configured to react with the first material to form a water resistant barrier.

19. The mobile device of claim 16, wherein an internal surface of the first conductive layer is at least partially covered with a water resistant coating.

20. The mobile device of claim 16, wherein the water resistant connector is exposed to an ambient environment of the mobile device.

* * * * *